(12) United States Patent
Beebe et al.

(10) Patent No.: US 6,248,668 B1
(45) Date of Patent: Jun. 19, 2001

(54) DENDRITIC MATERIAL SACRIFICIAL LAYER MICRO-SCALE GAP FORMATION METHOD

(75) Inventors: David Beebe, Savoy; Hyuk-Jeen Suh, Champaign; Jeffrey S. Moore, Savoy; Pamidighantam Bharathi, Champaign, all of IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/483,153

(22) Filed: Jan. 14, 2000

(51) Int. Cl.[7] .................. H01L 21/302; H01L 21/311
(52) U.S. Cl. ................ 438/702; 216/11; 216/39; 438/763; 438/759
(58) Field of Search ............... 216/11, 39; 438/32, 438/702, 763, 759, 976, FOR 388

(56) References Cited

U.S. PATENT DOCUMENTS 4,371,406 * 2/1983 Li.

OTHER PUBLICATIONS

E.E. Hui, C.G. Keller, R.T. Howe, "Carbonized Parylene as a Conformal Sacrificial Layer", presented at Solid–State Sensor and Actuator Workshop, Hilton Head Island, South Carolina, Jun. 8–11, 1998, pp. 256–260.

* cited by examiner

Primary Examiner—George Fourson
Assistant Examiner—Joannie A. Garcia
(74) Attorney, Agent, or Firm—Greer, Burns & Crain, Ltd

(57) ABSTRACT

A micro-scale gap fabrication process using a dry releasable dendritic material sacrificial layer. The fabrication process produces micro-scale gaps, such as those required between a suspended microstructure and an opposing surface in MEMS. The dendritic sacrificial layer is releasable by heating the dendritic material past its decomposition point after forming the microstructure. The sacrificial layer may be applied to a wafer, for example, by spin coating a solution including the dissolved dendritic material. The sacrificial layer, after being formed, may be patterned and prepared for accepting structural material for the microstructure. After a desired microstructure or microstructures are formed around the sacrificial layer, the layer is dry releasable by heating.

7 Claims, 1 Drawing Sheet

DENDRITIC MATERIAL SACRIFICIAL LAYER MICRO-SCALE GAP FORMATION METHOD

This invention was made with Government support under Grant No. 55-97-0126 awarded by the Army Research Office. The Government has certain rights in the invention.

FIELD OF THE INVENTION

The present invention concerns micromechanical systems (MEMS) and microelectronics.

BACKGROUND OF THE INVENTION

MEMS have many applications including micro optical components, such as Fresnel lenses, optical gratings and corner cube reflectors. The structures are usually fabricated on a silicon substrate. Microelectronics encompass an even broader range of devices. In the field of microelectronics, micro-scale gaps are sometimes required for insulation between two materials.

Some MEMS require a microstructure, typically formed of polysilicon or nickel, to extend suspended, free standing in space, from another portion of the MEMS device. This is achieved in microfabrication by forming the microstructure around a sacrificial layer, which is later removed to release the microstructure. Conventionally, the selective release of a suspended microstructure is accomplished by a wet etch process to remove the sacrificial layer.

Wet etch release has the drawback of stiction, where the liquids used in etching cause adhesion between the suspended microstructure and other portions of the MEMS being fabricated. The stiction results from process induced capillary action. Often, the small microstructure possesses insufficient restoring forces to overcome the adhesion and the result is a useless device. Artisans have sought to overcome stiction in the wet etch process. Techniques have been developed with the use of diffusion etch holes and without, but such techniques slow the etch process and still suffer problems, though reduced, from stiction.

Hui et al, developed a dry release process described in "Carbonized Parylene as a Conformal Sacrificial Layer", Proceedings from the Solid State Sensor and Actuator Workshop, Hilton Head Island, S.C., Jun. 6–11, 1998. This technique, being a dry release, avoids problems of stiction altogether. However, this technique embodies careful handling requirements and a limited process window. Specifically, the technique requires deposition of an adhesion layer, a flow prevention hardening step in a $CHF_3$ and He plasma, a pre-bake in $N_3$, a carbonization step at 700° C.–1000° C. for an hour, and an oxidation step at 700° C. for an hour.

Accordingly, there is a need for an improved suspended microstructure release process which addresses some or all of the aforementioned problems. Applications requiring micro-scale gaps similar to those between a suspended microstructure and an opposing surface would similarly benefit from such a process. These needs are met by the present dendritic sacrificial layer dry release micro-scale gap formation method.

SUMMARY OF THE INVENTION

That and other needs are met or exceeded by the present micro-scale gap fabrication process using a dry releasable dendritic material sacrificial layer. The dendritic sacrificial layer is removed by decomposing the dendritic material, for example, by heating it past its decomposition point. This may release a formed microstructure, or create a gap between materials. The sacrificial layer may be applied to a wafer, for example, by spin coating a solution including the dissolved dendritic material. The sacrificial layer, after being formed, may be patterned and prepared for accepting structural material for the microstructure. After a desired microstructure or microstructures are formed around the sacrificial layer, the layer is dry releasable by heating or other dry decomposition technique.

In a preferred embodiment, a sacrificial layer of dendritic material is formed on a wafer. A mask pattern is then formed on the sacrificial layer and the sacrificial layer is patterned according to the mask, after which, the mask is removed. A photoresist layer is then formed in a pattern on the wafer. The photoresist layer permits a particularly configured microstructure to be formed, and the sacrificial layer is then dry released.

BRIEF DESCRIPTION OF THE DRAWINGS

Other features, objects and advantages of the invention will be apparent to artisans from the detailed description and drawings, of which.

DETAILED DESCRIPTION OF THE PREFERRED EMBODIMENTS

Figure 1A:
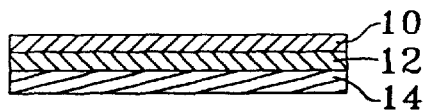
FIGS. 1a–1m illustrate steps in a preferred embodiment dendritic sacrificial layer suspended dry release method in accordance with the present invention.

In the present invention, a dendritic sacrificial layer provides for a dry release to form a micro-scale gap between opposing material surfaces, i.e., a gap of having micro metric dimensions. The present method is quick, robust, and is compatible with conventional MEMS fabrication techniques which require release of a suspended microstructure. A one-step dry release in the present method releases suspended microstructures or forms micro-scale gaps in other devices.

The simplicity of the release of the invention is possible through a sacrificial layer formed from a class of polymers known as dendritic materials. Dendritic materials are well-defined polymers generated from a single seed molecule or monomer. Unlike random-coil or cross-linked polymers, these dendrimers are created using a reiteration process of growing concentric tiers of monomers around an initiator core molecule. This layer-by-layer growing process permits chemical tailored endogenous and exogenous binding sites in the three anatomical components, the central monomer, repetitive branch units, and terminal functional groups. Thus, a polymer with tunable physical, chemical, mechanical, and electrical properties can be synthesized with the dendritic materials.

The preferred embodiment method described herein uses a particular hyper branched polymer, known as HB560 as the dendritic material. Its glass transition temperature is greater than its decomposition temperature, allowing dry release of microstructures without transitioning through the liquid phase and accordingly without substrate contact. Artisans will appreciate that other dendritic materials having glass transition temperatures above the decomposition temperatures will also be suitable. Apart from the glass transition temperature, other important properties of dendritic materials suitable for practicing the invention are a rigid molecular structure and a high carbon content, e.g. greater than about 75 wt. %. A sample class of dendritic materials exhibiting these latter properties are the aromatic containing dendritic materials. In a similar fashion, particular materials for the various other steps of the method do not limit the invention, e.g., various preparatory, substrate, mask and microstructure materials may be substituted as is known in the art.

A preferred embodiment method of the invention is illustrated in FIGS. 1a–1m The method commences with forming a dendritic sacrificial layer 10 on the surface of a substrate wafer formed from separate silicon dioxide layers 12 and 14, respectively. Forming the dendritic layer 10, in experiments conducted, was accomplished by spin coating from a solution including dissolved HB560. It is expected that spray coating and self-assembly are viable alternatives. Experimentation determined decane to be the best solvent to dissolve HB560. A 0.3 $\mu$m thick uniform HB560 film is obtained at 2000 rpm for 30 seconds, using a mixture of 200 mg of HB560 to 1 ml of decane. Thickness can be altered by changing the concentration of the solution or by forming additional layers of dendritic material. Either of these approaches will permit variance of the sacrificial layer thickness between free standing microstructures and an adjacent surface.

Figure 1B:
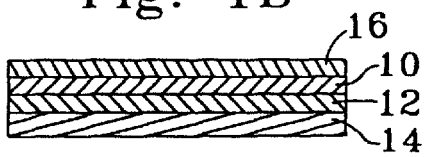
Figure 1C:
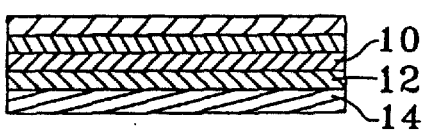
Figure 1D:
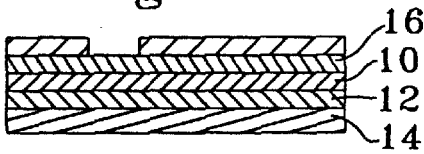
Figure 1E:
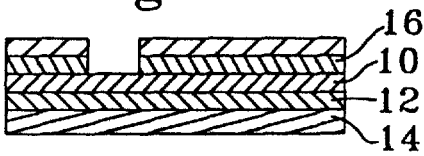
Figure 1F:
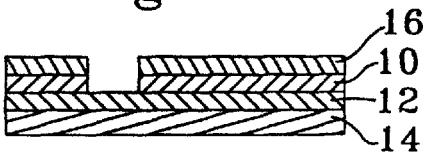
Figure 1G:
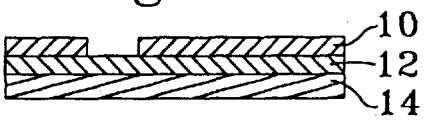
Figure 1H:
Figure 1I:
Figure 1J:
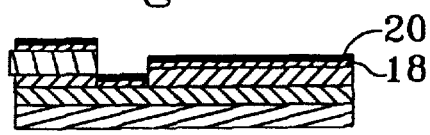
Figure 1K:
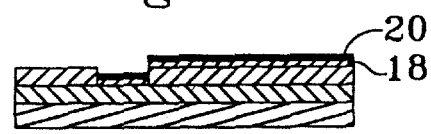
Figure 1L:
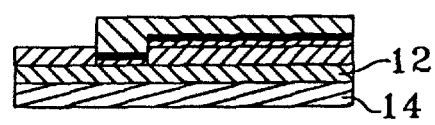
Figure 1M:
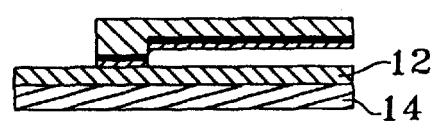

In FIG. 1b, a mask layer 16 of aluminum is formed. The mask is patterned, for example, through a photoresist coat and develop, as shown in FIGS. 1c and 1d followed by an aluminum etch, FIG. 1e. The dendritic material is etched as shown in FIG. 1f. The mask layer is removed in FIG. 1g. Areas for deposit of the microstructure are then defined by an additional photoresist coat and develop in FIGS. 1h and 1i, leaving photoresist present where the microstructure is not to be formed. A seed layer is formed in FIG. 1j, of a titanium layer 18 and a copper layer 20. The seed layer is removed in areas protected by photoresist in FIG. 1k by removing the photoresist. In FIG. 1l, the microstructure is formed on the seed layer 18, 20, and a dry release is accomplished in FIG. 1m by heating the sacrificial layer past its decomposition temperature. Whether or not a seed layer is necessary will depend on the choice of structural material and underlying material.

Using this method, an array of cantilever beams 100 $\mu$m×100 $\mu$m~1000 $\mu$m were designed and fabricated as test devices. A ratio of 200 mg of HB560/ 1 ml decane produced an HB560 solution. Two layers of the HB560 solution, at a spin rate of 2000 rpm for 30 seconds, were deposited for a total thickness of 0.6 $\mu$m. The HB560 was then baked at 250° C. for 10 minutes in air to cure it. A 1000 Å mask layer of aluminum was deposited for masking the HB560. The HB560 was patterned through reactive ion etching. The aluminum was then removed during a 2.5 minute immersion in AZ®351. Photoresist was spun and patterned for lift-off of a Ti/Cu seed layer. 100 Å of titanium and 500 Å of Copper were then deposited as a seed layer for better adhesion between HB560 and nickel, used as a microstructure material. Lift-off was then achieved by agitating in acetone at 90° C. for 10 minutes. Approximately 12 $\mu$m of Nickel was electroplated on the patterned Ti/Cu/HB560 stack. The cantilever beams were dry released by heating the sample up to 600° in $O_2$ at 50° C./min, allowing a dwell time at 600° for 10 minutes to effect complete release. Smaller sized structures will, of course, reduce this favorable release time. Other materials meeting the properties defined previously herein may exhibit even faster release times. Other materials meeting the properties defined previously herein may also release at lower temperatures dependent on their particular decomposition temperature. Certain materials may not require an oxygen atmosphere for decomposition. In addition, other techniques causing dry decomposition of the sacrificial layer may replace heating, e.g., irradiation.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for forming a micro-scale gap between surfaces, the method comprising steps of:

forming a patterned sacrificial layer of dendritic material on a surface;

forming a structural material on at least the sacrificial layer; and dry releasing the sacrificial layer to separate at least a portion of the structural material and the surface thereby defining a gap between a surface of the structural material and the surface.

2. The method according to claim 1, wherein said step of dry releasing comprises heating the sacrificial layer.

3. The method according to claim 1, wherein said step of forming comprises:

creating a liquid solution including the dendritic material; and spin coating the dendritic material on the surface.

4. The method according to claim 3, wherein the dendritic material comprises HB-560.

5. The method according to claim 3, wherein said step of creating a liquid solution comprises dissolving the dendritic material into a solvent.

6. The method according to claim 1, further comprising a step of:

forming a seed layer on the dendritic material prior to said step of forming said structural material.

7. A method for forming one or more suspended microstructures, the method comprising steps of:

forming a sacrificial layer of dendritic material on a wafer;

forming a mask pattern on the sacrificial layer;

patterning the sacrificial layer;

removing the mask pattern;

forming a pattern of photoresist on the wafer;

forming a microstructure in accordance with the pattern of photoresist;

dry releasing the sacrificial layer by heating.

* * * * *